United States Patent [19]

Coe

[11] 4,270,137
[45] May 26, 1981

[54] FIELD-EFFECT DEVICES

[75] Inventor: David J. Coe, Redhill, England

[73] Assignee: U.S. Philips Corporation, New York, N.Y.

[21] Appl. No.: 970,033

[22] Filed: Dec. 15, 1978

[30] Foreign Application Priority Data

Dec. 15, 1977 [GB] United Kingdom ............... 52209/77
Sep. 8, 1978 [GB] United Kingdom ............... 36153/78

[51] Int. Cl.³ ..................... H01L 29/78; H01L 29/40; H01L 27/02
[52] U.S. Cl. ......................................... 357/53; 357/23; 357/59; 357/51
[58] Field of Search ....................... 357/52, 53, 59, 51, 357/23

[56] References Cited

U.S. PATENT DOCUMENTS

| 3,946,418 | 3/1976 | Sigsbee | 357/53 |
|---|---|---|---|
| 4,009,483 | 2/1977 | Clark | 357/53 |
| 4,035,829 | 7/1977 | Ipri et al. | 357/53 |
| 4,172,260 | 10/1979 | Okabe et al. | 357/53 |

FOREIGN PATENT DOCUMENTS 51-93878 8/1976 Japan ......................................... 357/53

Primary Examiner—Andrew J. James
Attorney, Agent, or Firm—Thomas A. Briody; Robert T. Mayer; Paul R. Miller

[57] ABSTRACT

A field-effect device, e.g. an insulated-gate field-effect transistor has field-relief means in the form of a polycrystalline silicon or other resistance layer connected between its gate and drain electrode to permit during operation of the device the formation of a potential distribution ($V_G$, $V_D$) along the resistance layer. The resistance layer and its potential distribution extend over the current path in a low-doped drain zone to permit a high drain breakdown voltage without an unacceptable increase in drain series resistance or unacceptable decrease in transconductance.

9 Claims, 6 Drawing Figures

FIELD-EFFECT DEVICES

This invention relates to field-effect devices, particularly but not exclusively insulated-gate field-effect transistors (IGFET's) both in the form of discrete transistors (for example for use at high frequency) and as circuit elements of a monolithic integrated circuit.

Conventional IGFET's comprise highly doped (N+ or P+) source and drain regions separated by a channel area of the transistor; a gate (for example of metal or doped polycrystalline silicon) is situated over and insulated from the channel area; the source and drain regions are associated with source and drain electrodes respectively, and the gate has a separate connection to permit it to be biased independently of the drain and source.

An important factor which limits the maximum operating voltage of a conventional IGFET is the occurrence of breakdown at the insulator-semiconductor interface adjacent the edge of the highly-doped drain region adjoining the channel area. High electrostatic fields which occur in the gate-drain overlap area result in either dielectric breakdown of the gate insulating layer or avalanche breakdown in the semiconductor material at the said edge of the drain region. In the semiconductor body these high fields are caused both by the curvature of the drain junction and by the reflection into the semiconductor of the high field in the insulating layer in accordance with Gauss's law. Similar problems can occur with, for example, Schottky-gate field-effect transistors and other field-effect devices.

U.S. Pat. No. 3,845,495 discloses a field-effect device (in the form of an IGFET) comprising a semiconductor body in which a channel area of the device is present; a drain zone also present in the body is situated adjacent the channel area; a drain electrode is electrically connected to the drain zone; a gate is situated over and separated from the channel area by a barrier layer; the gate has a gate connection for biasing the gate independently of the drain electrode to control by field-effect action across the barrier layer the passage of charge-carriers along a current path through the channel area; the device has field-relief means connected to the gate and extending above the drain zone towards the drain electrode; the drain zone has a sufficiently low doping that during operation of the device the field-relief means serve to spread the electrostatic field which occurs in this low-doped drain zone and to reduce at the body surface the magnitude of the field at the edge of the low-doped drain zone adjacent the channel area. These field-relief means are in the form of a metal field-plate situated on an insulating layer above part of the low-doped drain zone so as to overlie substantially all of the depletion layer in the drain zone. The field-plate is provided as a lateral extension of the metal gate towards the drain electrode. The low-doped drain zone is constituted by the main portion of the semiconductor body in which source, channel and a higher-doped drain region are formed by dopant diffusion; this low-doped drain zone thus has a lower conductivity-type determining doping concentration than the channel so that the depletion layer will expand more in this drain zone than it does in the channel area. The field-plate spreads the associated electrostatic field slightly in this low-doped drain zone and reduces the surface electrostatic field by field-effect action across the insulating layer so that breakdown will occur within the semiconductor body (at a higher drain voltage) and not at the surface (at a lower drain voltage).

Such a known device can therefore have a high breakdown voltage associated with its drain. However such a construction has certain disadvantages. Because the gate metallization is extended towards the drain electrode the entire potential difference occurring during operation between the gate and the drain is applied across part of the insulating layer, both vertically between the gate metallization and drain zone and laterally between the gate metallization and drain electrode; this can result in high voltage breakdown across the insulating layer, and for some applications undesirable feedback capacitance between the drain and gate.

In order to reduce this feedback capacitance and particularly in order to avoid voltage breakdown across the thickness of the insulating layer, it is necessary for this insulating layer between the field-plate and the drain zone to be comparatively thick. Thus, for example, U.S. Pat. No. 3,845,495 gives a range of 0.8 to 1.5 microns ($\mu m$) for the thickness of this insulating layer, as compared with a range of 0.09 to 0.13 microns ($\mu m$) for the thickness of the insulating layer between the gate and the channel area of the IGFET.

However, the thicker the insulating layer the less effective is the field-effect action of the field-plate on the drain zone so that the doping of the drain zone has to be lower in order to obtain a sufficient spread of the depletion layer in the drain zone under the field-plate and a sufficient reduction in the magnitude of the field at the edge of the field-plate. Thus, U.S. Pat. No. 3,845,495 gives a range of a few ohm.cm. to 50 ohm.cm. for the resistivity of the drain zone; this is equivalent to a donor doping concentration of $2 \times 10^{15}$ to $10^{14}$ dopant atoms per c.c., and can result in a significant drain series resistance in that part of the current path which during operation occurs in an undepleted part of this high resistivity drain zone.

Breakdown between the gate and drain electrode across the surface of the insulating layer can be avoided by adequately spacing the edge of the field-plate extension of the gate from the drain electrode. Increasing this spacing can however increase the length of that part of the current path which occurs in the undepleted part of the high resistivity drain zone and so adversely affects the drain series resistance.

A further disadvantage is that the transconductance (gm) of the device can be reduced at high current levels by such an increase in the thickness of the insulating layer or such an increase of the spacing between the field-plate and the drain electrode.

The present invention involves the recognition that by combining with a low-doped drain zone an overlying resistance layer electrically connected between a gate and drain electrode of a field-effect device, an advantageous device structure can be obtained which may have a high breakdown voltage without an unacceptable increase in drain series resistance or unacceptable decrease in transconductance (gm).

According to the present invention a field-effect device comprising a semiconductor body in which a channel area of the device is present, a drain zone present in the body and situated adjacent the channel area, a drain electrode electrically connected to the drain zone, a gate situated over and separated from the channel area by a barrier layer, a gate connection for biasing the gate independently of the drain electrode to control by field-effect action across the barrier layer the passage of charge-carriers along a current path through the channel area, and field-relief means connected to the gate and extending above the drain zone towards the drain electrode, the drain zone having a sufficiently low doping that during operation of the device the field-relief means serve to spread the electrostatic field which occurs in this low-doped drain zone and to reduce at the body surface the magnitude of the field at the edge of the low-doped drain zone adjacent the channel area, is characterized in that the field-relief means comprise a resistance layer which extends over the low-doped drain zone and is electrically connected between the gate and drain electrode to permit during operation of the device the formation of a potential distribution along the resistance layer between the gate and drain electrode, and over the current path in the underlying low-doped drain zone.

The potential distribution formed in the resistance layer during operation of the device serves to spread the electrostatic field and an associated depletion layer across the low-doped drain zone and to reduce the magnitude of the field in the drain zone below the gate edge. Compared with a conventional field-effect device the electrostatic field distribution in the critical area between the gate and drain can thus be considerably relieved, allowing a significant increase in the breakdown voltage. Due to the low doping of the drain zone the drain series resistance is increased compared with a conventional field-effect device having a highly-doped drain; however the provision of the resistance layer over this low-doped drain zone causes the breakdown voltage to increase at a significantly higher value of drain doping than that observed with a conventional insulating layer above a low-doped drain; in addition, some accumulation of charge-carriers occurs in the low-doped drain zone below the resistance layer as a result of its potential distribution; both these effects help to reduce the increase in drain series resistance.

Because the potential difference between the gate and the drain is distributed along the resistance layer between the gate and drain electrode, the whole of this potential difference is not applied across the thickness of an insulating layer between the gate and drain zone; thus a thick insulating layer is not required below the resistance layer for avoiding breakdown across the insulating layer or undesirable feed-back capacitance between the drain and gate; thus the low-doped drain zone need not have such a high resistivity as that given for the known device of U.S. Pat. No. 3,845,495 so reducing the increase in drain series resistance and reducing the reduction in transconductance (gm) at high current levels. In the case of a resistance layer of very high resistivity material, for example oxygen-doped polycrystalline silicon, no insulating layer may be necessary between the resistance layer and the drain zone. Because the resistance layer extends over the current path in the low-doped drain zone, the potential distribution along this layer can influence the conductivity of this current path by increasing the number of free charge-carriers at the gate end of the current path and by reducing the length of the undepleted part of the drain zone at the drain electrode end. Both these effects can reduce both the reduction in the transconductance (gm) and the increase in the series resistance in this current path. For devices designed for operation above about one hundred volts, the conductivity-type determining doping concentration of the low-doped drain zone may be less than $5 \times 10^{17}$ and even less than $2 \times 10^{17}$ dopant atoms per c.c.; it may be, for example, at most $10^{17}$ dopants atoms per c.c. Such doping concentrations are at least one or two orders of magnitude smaller than those of the high-doped p+ or n+ drain of a conventional field-effect transistor and by choosing such low doping values, the breakdown voltage may be increased by about an order of magnitude compared with a device with high drain zone doping, as will be described hereinafter.

However the conductivity-type determining doping concentration of the low-doped drain zone need not be as low as that of the high-resistivity drain-zone of U.S. Pat. No. 3,845,495. Thus, in order to reduce the increase in drain series resistance introduced by the low-doped drain zone its conductivity-type determining doping concentration is preferably at least $10^{16}$, for example $2 \times 10^{16}$ dopant atoms per c.c.

An insulating layer may be present on the semiconductor body surface to separate the drain zone from the overlying resistance layer; by insulating the resistance layer from the low-doped drain zone leakage currents through the resistance layer between the gate and the drain zone are reduced; this insulation can be particularly important for high frequency applications. This insulating layer may also extend above the channel area to separate the channel area from the gate in an insulated-gate field-effect device; since because of the potential distribution in the resistance layer this insulating layer does not necessarily have to be thicker below the resistance layer, it may be of substantially the same thickness both below the resistance layer and below the gate. Thus it can be formed as a single uniformly-thick layer across which a significant field-effect action of the resistance layer can be obtained with higher doping levels for the drain zone than that given in U.S. Pat. No. 3,845,495.

The low-doped drain zone may have a higher conductivity-type determining dopant concentration than the channel area; this higher doped drain zone may be formed as a surface zone which, for example, overdopes a portion of the body which also provides the adjacent channel area. This results in the most unusual situation in which because of the potential distribution in the resistance layer the electrostatic field is spread in the higher-doped drain zone rather than in the lower-doped channel area, whereas if the resistance layer were not present the depletion layer and associated field would tend to expand more in the channel area than in the higher-doped drain zone.

The drain electrode could in some cases directly contact the low-doped drain zone in order to be electrically connected thereto. However in order to reduce the drain contact resistance a drain region which is more highly doped than the drain zone is preferably associated with the drain electrode. In some devices in accordance with the invention this higher-doped drain region may actually form the drain electrode. However in other devices also in accordance with the invention the higher-doped drain region forms a contact region of the drain and is contacted at the semiconductor body surface by the drain electrode. The lower-doped drain zone may be shallower than the more highly-doped drain region and may extend laterally from this drain region towards the channel area.

In another form, however, the low-doped drain zone is a semiconductor body portion in which doped areas are present to form the more highly-doped drain region and the channel area; the channel area so formed in such a low-doped drain zone can be very short as will be described hereinafter.

The resistance layer and gate may comprise parts which adjoin each other, one of the parts being situated on top of the other of the parts. Similarly, the resistance layer and drain electrode may comprise parts which adjoin each other, one of the parts being situated on top of the other of the parts. By having such structures good electrical connection can be made between the resistance layer and the gate and drain electrode in a compact manner and over sizeable contact areas.

The device may be a feld-effect transistor. However, it may also be another kind of field-effect device, for example a charge-coupled device (C.C.D.) in connection with an output of which the invention may be used in a similar manner and with similar advantages as with a drain of a transistor. Transistors in accordance with the invention may be IGFET's in which the gate is separated from the channel area by an insulating layer, or they may be, for example Schottky-gate field-effect transistors in which the gate is separated from the channel area by a Schottky (metal-semiconductor) rectifying junction. The gates of these transistors are capacitively coupled to the underlying channel area across the barrier layer which is formed in one case by the insulating layer or in the other case by the Schottky junction.

As mentioned hereinbefore the resistance layer may be of oxygen-doped polycrystalline silicon. U.S. Pat. No. 4,012,762 teaches the use of a layer of oxygen-doped polycrystalline silicon as a so-called field-oxide extending around outside the active IGFET area which contains the source, drain and channel area of a conventional IGFET; this polycrystalline layer is covered with a layer of silicon oxide and prevents the formation of unwanted parasitic inversion layers at the semiconductor body surface outside the active region; in this way the breakdown voltage of the drain region is improved at its side remote from the channel area. This U.S. Pat. No. 4,012,762 contains no teaching on improving the breakdown voltage at the side of drain adjacent the channel. For convenience in manufacture, the double-layer field-oxide is provided everywhere except under the gate where a thinner gate oxide is provided. Thus, in the device shown this double-layer is also present on the semiconductor body surface between the gate and the drain electrode. However it is not clear from this U.S. Pat. No. 4,012,762 that the oxygen-doped polycrystalline silicon layer under the silicon oxide layer would contact the gate and drain electrode so as to be electrically connected thereto. Even if this polycrystalline silicon layer were electrically connected between the gate and drain electrode, the breakdown voltage at the channel side of the drain region would not be improved, as will become apparent hereinafter, because the device has a conventional n+ or p+ highly-doped drain region without any lower-doped drain zone.

In order to illustrate the realisation of these and other features in accordance with the invention and their advantages, embodiments of the invention will now be described, by way of example, with reference to the accompanying diagrammatic drawings, in which.

Figure 4:
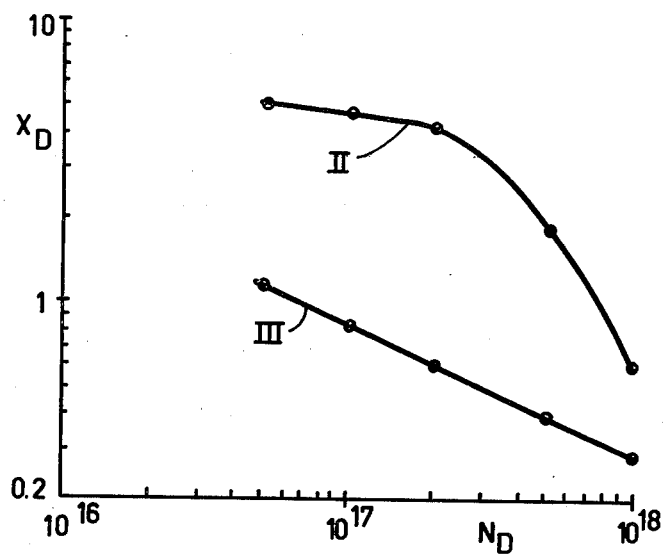
FIG. 4 is a graph showing the extent $x_D$ of a depletion layer along the surface of a drain zone as a function of the doping $N_D$ of the drain zone for the IGFET structures of both FIGS. 2 and 3.
Figure 5:
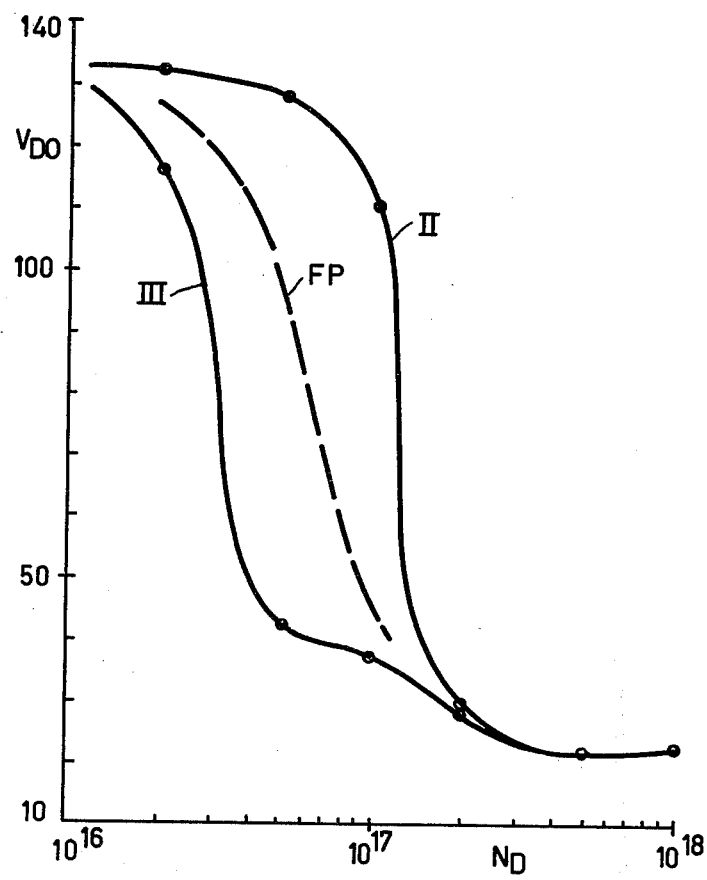
FIG. 5 is a graph showing the drain breakdown voltage $V_{DO}$ as a function of the doping $N_D$ of the drain zone for the IGFET structures of both FIGS. 2 and 3.

It should be noted that FIGS. 1, 2, 3, and 6 are diagrammatic and not drawn to scale; the relative dimensions and proportions of some parts of these Figures have been shown exaggerated or reduced for the sake of clarity and convenience. The same reference numerals as used in one Figure are generally used to refer to the same or similar parts in the other Figures. It should also be noted that the graphs of FIGS. 4 and 5 are based on calculations involving assumptions about the magnitude of certain common parameters and so merely illustrate relative changes in both the breakdown voltage $V_{DO}$ and extent $x_D$ of the depletion layer with change in the drain doping $N_D$ and device structure, rather than illustrating absolute magnitudes of the breakdown voltage $V_{DO}$ and depletion layer extension $x_D$.

Figure 1:
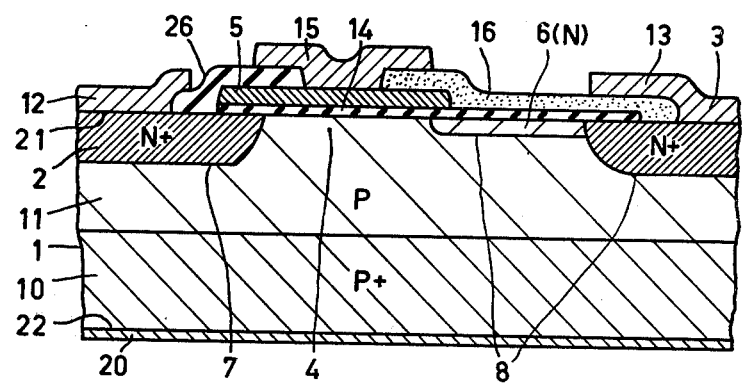
FIG. 1 is a cross-sectional view of a portion of the semiconductor body of an IGFET in accordance with the invention.

FIG. 1 illustrates an n-channel enhancement-mode discrete IGFET in accordance with the present invention and which may be suitable for use at high frequencies. The IGFET comprises a monocryatalline semiconductor body 1 which may be of silicon and in which there are provided highly-doped (N+) source and drain regions 2 and 3 associated with source and drain electrodes 12 and 13. The body 1 shown in FIG. 1 comprises a low resistivity (P+) substrate 10 of p-type conductivity having thereon a higher resistivity p-type epitaxial layer 11. The n-type source and drain regions 2 and 3 are present in the epitaxial layer 11 adjacent its surface 21 and form p-n junctions 7 and 8 with the layer 11. If desired, the source region 2 may be shorted to the epitaxial layer 11 and substrate 10 by the source electrode layer 12 for example at a groove in the layer 12, and the substrate 10 may be contacted at its surface 22 by an electrode layer 20.

The N+ source region 2 adjoins a channel area 4 of the transistor. A gate 5 is situated over the channel area 4 and is separated therefrom by a barrier layer in the form of a thin insulating layer 14. The gate 5 may be of polycrystalline silicon doped with, for example, donors so as to have a low resistivity. The gate 5 is contacted by an electrode layer 15 which forms a connection for biasing the gate 5 independently of the source and drain.

An n-type zone 6 is situated adjacent the opposite end of the channel area 4 from the highly-doped (N+) source region 2. The donor doping of the zone 6 is lower than that of the drain region 3 but higher than the acceptor doping in the channel area 4. The drain electrode 13 is connected to the zone 6 via the highly-doped drain region 3 which as shown may be deeper than the zone 6. The zone 6 extends from the region 3 towards the channel area 4, and therefore forms a lower-doped extended drain zone of the transistor which separates the drain region 3 from the channel area 4 and extends the junction 8 formed with the layer 11.

Figure 2:
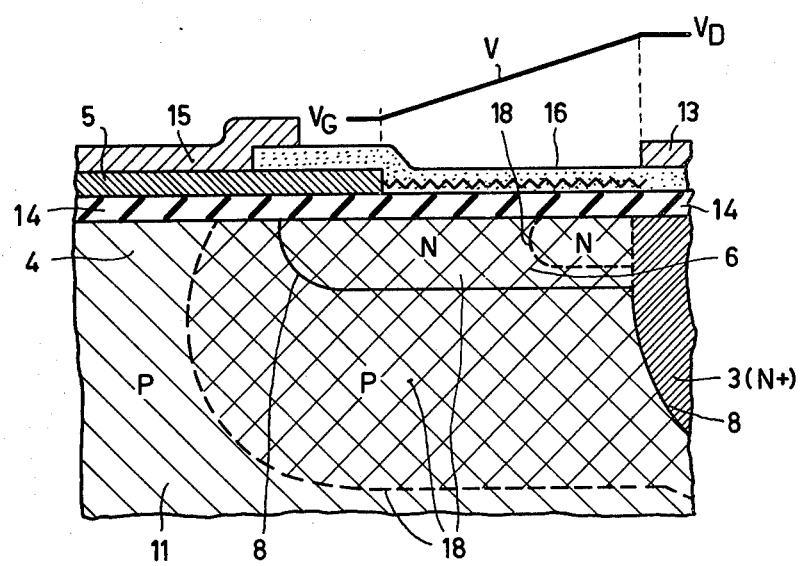
FIG. 2 is a cross-sectional view of part of the semiconductor body portion of FIG. 1 illustrating the potential distribution in its resistance layer and the extent of a depletion layer in the semiconductor material.

A resistance layer 16 extends over the drain zone 6 and is electrically connected between the gate 5 and the drain electrode 13 to permit the formation of a potential distribution along the layer 16 between the gate 5 and drain electrode 13 during the operation of the transistor. This potential distribution is illustrated in FIG. 2 and results from the difference between the gate potential $V_G$ and the drain potential $V_D$. FIG. 2 shows a linear fall-off in potential along the layer 16 between the connection to the drain electrode 13 and the connection to the gate 5. As shown in FIGS. 1 and 2, part of the resistance layer 16 extends on top of part of the gate 5 to form a good electrical connection between the layer 16 and gate 5. Similarly, part of the drain electrode 13 extends on top of part of the layer 16.

The potential distribution in the layer 16 is applied to the surface of part of the gate insulating layer 14 where it separates the low-doped drain zone 6 from the resistance layer 16. The zone 6 has a sufficiently low conductivity-type determining doping concentration that this potential distribution capacitively coupled across the layer 14 spreads the electrostatic field which during the operation of the transistor occurs in the drain zone as a result of a depletion layer 18 formed at the reverse-biased junction 8 between the extended drain region 3, 6 and the layer 11. In this way the magnitude of the electrostatic field at the edge of the drain zone 6 adjacent the channel area 4 is reduced. Because the layer 16 extends over the whole distance from the gate 5 to the drain electrode 13 the potential distribution along this layer 16 can influence the whole length of the current path in the zone 6 from below the edge of the gate 5 to the region 3. The extent of the depletion layer 18 is indicated in FIG. 2 by criss-cross shading and a broken-outline. Both FIGS. 2 and 3 illustrate the situation where the gate potential $V_G$ is less than the threshold voltage for establishing conduction in the channel area 4.

Figure 3:
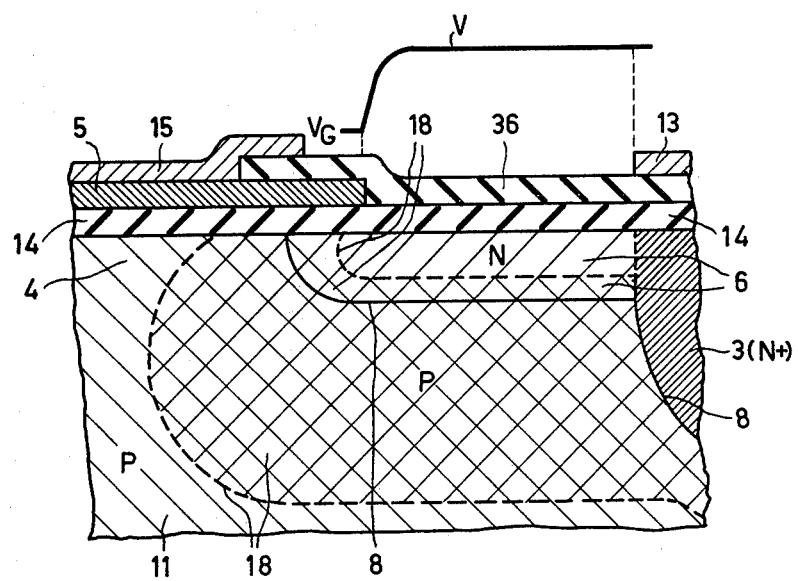
FIG. 3 is a cross-sectional view of part of a semiconductor body portion similar to FIG. 2 but of an IGFET not in accordance with the present invention.

FIG. 3 is similar to FIG. 2 but illustrates the situation which arises when the resistance layer 16 is replaced by a wholly insulating layer 36 which may be of, for example, deposited silicon oxide. In this case, there is no resistive connection between the gate 5 and drain electrode 13, and the electrostatic field lines associated with the layer 36 are constrained to extend substantially perpendicular to the interface between the layers 36 and 14. Apart from the replacement of the resistance layer 16 by the insulating layer 36 the IGFET of FIG. 3 is assumed to have the same dimensions, materials and doping concentrations as the IGFET of FIG. 2. It will be noted that the depletion layer 18 does not spread as far in the zone 6 in FIG. 3 as in FIG. 2, so that more of the zone 6 is undepleted in FIG. 3 and so adds to the drain series resistance. In the structure of FIG. 2, the free-carrier concentration at the semiconductor-insulator interface is enhanced by the potential distribution in the resistance layer 16 which acts as a potential divider between the gate 5 and the drain electrode 3 over the whole drain zone 6 and this reduces the drain series resistance in the zone 6, compared with the structure of FIG. 3.

In a modification of the FIG. 3 structure the spread of the depletion layer 18 in the low-doped drain zone 6 can be increased by extending the gate 5 itself across the insulating layer 14 towards the drain electrode 13 so as to act as a field-plate over part of the drain zone 6. However in this case the potential difference between the gate and drain would be applied directly across the thickness of the insulating layer 14 so that this layer 14 would need to be thicker below the field-plate than below the original gate itself so as to avoid breakdown in the insulator or semiconductor near the edge of the field-plate; the effect of the field-plate would decrease with increase in the thickness of the insulating layer 14 unless the doping of the drain zone 6 is also reduced, but a reduction in this drain doping would increase the drain series resistance contributed by an undepleted length of the now higher resistivity drain zone 6. The transconductance (gm) at high current levels could also be decreased.

FIGS. 4 and 5 show the result of calculations of the effect of the net average doping level $N_D$ of the extended drain zone 6 on the extension $x_D$ of the depletion layer 18 in the zone 6 and on the drain breakdown voltage $V_{DO}$ for the IGFET structures of FIGS. 2 and 3. The calculations were made for source and gate potentials of 0 volts, and improvement in the device breakdown voltage was sought for the IGFET structures having the following specifications: a length of 5 microns for the channel area 4, a uniform thickness of 0.1 micron ($\mu$m) for a gate insulating layer 14 of silicon oxide, a depth of 0.5 micron ($\mu$m) and a length of 5 microns ($\mu$m) for the drain zone 6, and a net acceptor doping level of $10^{15}$ atoms per c.c. for the p-type epitaxial layer 11: in addition a drain potential $V_D$ of 50 volts was used to obtain the results of FIG. 4.

As the doping in the extended drain zone 6 is reduced the peak electrostatic field at the edge of the drain zone 6 adjacent the channel area 4 is similarly reduced, simultaneously the extension $x_D$ of the depletion layer 18 into the drain zone 6 along the semiconductor-insulator interface increases as shown in FIG. 4. In FIG. 4, the ordinate $x_D$ is in microns and the abscissa $N_D$ is in donor atoms/cc. Curve II is for the FIG. 2 IGFET structure, whereas curve III is for the FIG. 3 IGFET structure which is not in accordance with the present invention. For the FIG. 3 structure the increase in the interfacial drain depletion width $x_D$ follows an inverse square-root dependence on drain doping $N_D$; a maximum penetration of approximately 1 micron may be obtained for $N_D$ of approximately $5 \times 10^{16}$ so that a considerable length of the 5 microns long low-doped drain zone 6 remains undepleted and significantly increases the drain series resistance. For the FIG. 2 structure (curve II), however, the increase in depletion width $x_D$ with decrease in drain doping $N_D$ is much greater than for the FIG. 3 structure (curve III) and is rapidly limited by the available length of the zone 6 (which was chosen to be 5 microns).

Furthermore as the drain doping $N_D$ is decreased the peak value of the electrostatic field associated with the depletion layer 18 is found to transfer along the semiconductor-insulator interface from the edge of the drain zone 6 adjacent the channel area 4 to the edge of the gate 5 adjacent the resistance layer 16.

FIG. 5 shows the results of calculations comparing the drain breakdown voltages $V_{DO}$ at different doping levels $N_D$ for the same two IGFET structures. The ordinate $V_{DO}$ is in volts, the abscissa $N_D$ is again in donor atoms per c.c., and the curves II and III again represent respectively the structures of FIGS. 2 and 3.

As is apparent from FIG. 5, when the doping of the drain zone is high both the transistor structures of FIGS. 2 and 3 have substantially the same low breakdown voltage and the presence of the resistance layer 16 connected between the gate 5 and drain electrode 13 has no effect on the breakdown voltage. A drain breakdown voltage $V_{DO}$ of only about 20 volts may be obtained for an average doping $N_D$ of $10^{18}$ atoms per c.c., and for both transistor structures this may rise to about 30 volts at an average doping $N_D$ of $2 \times 10^{17}$ atoms per c.c. For lower values of $N_D$, the change in breakdown voltage $V_{DO}$ becomes significantly different for the two device structures as illustrated by the curves II and III in FIG. 5. For the FIG. 3 structure the breakdown voltage may rise to, for example, about 40 volts at an average doping of $5 \times 10^{16}$ atoms per c.c., while the corresponding value for the FIG. 2 structure in accordance with the invention may however be as high as 130 volts for example. These results show that by combining a low-doped drain zone 6 with an overlying resistance layer 16 connected between the gate 5 and drain electrode 13 it is possible to increase the maximum operating voltage of an IGFET by nearly an order of magnitude compared with conventional IGFET's having a highly-doped (P+ or N+) drain adjacent the channel area. The highly-doped (P+ or N+) drain of a conventional IGFET has a doping level of at least $10^{18}$ or $10^{19}$ dopant atoms per c.c. and usually very much greater.

For lower values of the drain zone doping $N_D$, the breakdown voltage of the FIG. 3 structure rises and can eventually approach values achieved by the FIG. 2 structure. Thus, at an average doping $N_D$ of $2 \times 10^{16}$ atoms per c.c., the drain breakdown voltage was just over 130 volts for the FIG. 2 structure and about 115 volts for the FIG. 3 structure. These results show that by combining with the low-doped drain zone 6 an overlying resistance layer 16 connected between the gate 5 and drain electrode 13 the transition between the low and high breakdown voltage states can be accomplished at drain zone dopings $N_D$ which are about five times higher than with IGFET's having an insulating layer 36 over a low-doped drain zone 6; this means that the series resistance contributed by an undepleted part of the drain zone 6 can be five times lower for such a device in accordance with the invention.

Since, for sufficiently low doping of the drain zone 6, the device structures of FIGS. 2 and 3 both achieve the same high breakdown voltage, it is apparent that zone 6 serves, by itself, to spread the field near the surface and to allow the full breakdown voltage capability of the p-n junction 8 formed by regions 3 and 11 to be attained. However, in addition to this function, drain zone 6 provides free-carriers for current transport at low values of drain voltage. Thus, the minimum doping level at which it will begin to exercise its field-spreading function becomes of crucial importance to the current handling capability of the device.

In the case of the device of FIG. 3 it is possible to extend the gate contact 15 and drain contact 13 over the insulating layer 36 above the drain zone 6 to form field plates. By appropriate choice of the thickness of the insulating layer 36 and the relative position of the field plates it is possible to optimise the structure of FIG. 3 so as to maximise the breakdown voltage achieved at any given value for the impurity doping of drain zone 6; this is depicted by curve FP in FIG. 5. However, until the doping in drain zone 6 falls to that corresponding to the high breakdown state of the unmodified FIG. 3 structure which does not have field plates, the avalanche breakdown region appears to remain at the semiconductor-insulator interface and the full voltage breakdown capability of the p-n junction 8 formed by regions 3 and 11 is not achieved.

From these results it can be seen that the doping level $N_D$ of the drain zone 6 of the IGFET described with reference to FIGS. 1 and 2 should be less than $2 \times 10^{17}$ to obtain an increase in breakdown voltage with the values given for the other doping levels and dimensions of the transistor, but that this doping level $N_D$ need not be lower than approximately $5 \times 10^{16}$ in order to reduce the increase in drain series resistance and other effects introduced by the low doping of the drain zone 6. The precise values preferred will of course differ for differing device specifications.

As mentioned hereinbefore, the final magnitude of the breakdown voltage achieved at low values of the drain zone doping $N_D$ in FIG. 5 is determined by breakdown of the p-n junction 8 in the bulk of the semiconductor at the highly-doped drain region 3. By appropriate design of the geometry of this region 3, this breakdown voltage will approach that of a plane p-n junction in the bulk of the semiconductor. By having low doping values for the epitaxial layer 11 and by suitably lengthening the drain zone 6, even higher values of the maximum possible breakdown voltage can be achieved.

The IGFET of FIGS. 1 and 2 may be manufactured using known techniques. The p-type epitaxial layer 11 may have a net acceptor concentration of, for example, $10^{15}$ dopant atoms per c.c., which corresponds to a resistivity of approximately 10 ohm.cm. The source and drain regions 2 and 3 can be formed by donor diffusion, for example, of phosphorus or arsenic and may have a surface concentration of, for example, $10^{20}$ donor atoms per c.c. The low-doping concentration of the drain zone 6 may be provided by implantation of, for example, phosphorus or arsenic ions, and if desired the implanted donor dose may subsequently be diffused slightly in the layer 11 to provide the zone 6 with the desired depth and donor concentration. Preferably the average donor concentration $N_D$ of the zone 6 is at most $10^{17}$ dopant atoms per c.c., and may be, for example, approximately $5 \times 10^{16}$; the depth of the zone 6 may be, for example 0.5 micron. The gate insulating layer 1 may be formed of, for example, thermally grown silicon oxide and may have a thickness of, for example, 0.1 micron. The gate 5 may be of, for example, polycrystalline silicon doped with donors to have a high conductivity. The source, drain and gate electrodes 12, 13, and 15 may be formed from, for example, a layer of aluminium.

In the structure shown in FIGS. 1 and 2 the resistance layer 16 is provided before the aluminium electrode layers 12, 13 and 15. The layer 16 may be of, for example, polycrystalline silicon. The polycrystalline silicon may be doped with oxygen so as to contain at least 2 atomic percent of oxygen and have a resistivity of more than $10^6$ ohm.cm. However, the layer 16 may be formed as a polycrystalline silicon layer which is either undoped or very lowly doped with acceptor or donor dopant, or it may be formed from other resistance materials; in this case its resistivity will generally be less than $10^6$ ohm.cm. Preferably the layer 16 should have a high resistance value along its length to reduce leakage currents between the gate 5 and drain electrode 13. For a resistance layer 16 of undoped polycrystalline silicon, the layer may have, for example, a thickness of 0.6 microns and a resistance of, for example, greater than $2 \times 10^7$ ohms between the gate 5 and drain electrode 13. In the case of a high resistivity material such as oxygen-doped polycrystalline silicon, the part of the insulating layer 14 separating the resistance layer 16 from the zone 6 may be omitted without significantly increasing leakage currents between the gate 5 and drain zone 6.

The layer portion 26 shown on the source side of the gate 5 may also be of oxygen-doped polycrystalline silicon which may be deposited simultaneously with the resistance layer 16 and may even form a continuous layer with the part 16 in the final device structure. However if desired this layer portion 26 may be of, for example, deposited silicon oxide. The layer portion 26 will generally also extend over the field portions of the surface 21 beyond the active device area.

It will be obvious that many other modifications are possible within the scope of this invention. Thus, for example, when the resistance layer 16 is formed of polycrystalline silicon which is un-doped or only lightly doped with donors or acceptors, it may be formed as a single continuous layer with the gate 5, the resistance layer part of this layer being masked during the doping of the gate part; such a modification is illustrated in FIG. 6.

Instead of the drain zone 6 extending laterally from a deeper drain region 3 towards the channel area 4, the drain zone 6 may be a high resistivity semiconductor body portion in which doped areas are present to form a more highly-doped drain region 3 and the channel area 4. Such an arrangement is shown in FIG. 6. In this case the source region 2 and the opposite conductivity type region providing the channel area 4 can be formed by dopant diffusion through the same window in a diffusion mask so obtaining a very short channel length. Because the main body portion now provides the drain zone 6 it of course must not be shorted to the source region 2 by the electrode 12.

Figure 6:
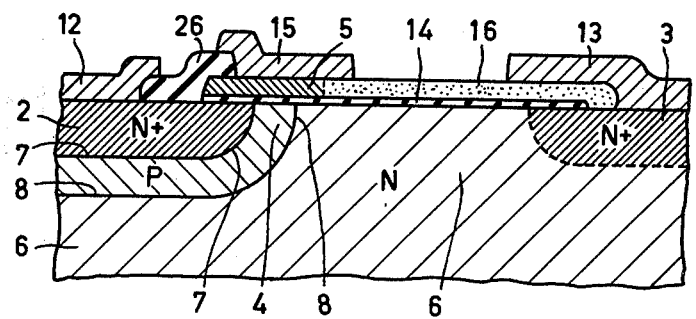
FIG. 6 is a cross-sectional view of a portion of a semiconductor body of another IGFET in accordance with the invention.

FIG. 6 also illustrates a modification in which the gate connection 15 and drain electrode 13 are extended a short distance towards each other over the drain zone 6 and in contact with the resistance layer 16. In this case, they can act as short field-plates at opposite ends of the potential distribution in the resistance layer 16; the resistance layer 16 now prevents sharp discontinuities in the electric field below the edge of these short field-plates as well as functioning in a similar manner to that of the previous embodiment.

Although only n-channel enhancement mode IGFET's have been shown, the invention may be used also with p-channel devices and with depletion-mode devices. The IGFET of FIGS. 1 and 2 may have dimensions and doping levels suitable for operation in high frequency power applications. The invention may also be used for IGFET's in integrated circuits.

Although in the IGFET's of FIGS. 1, 2 and 6 the channel area 4 extends horizontally and parallel to a major surface 21 of the semiconductor body 1, field-effect transistors in accordance with the invention may, if desired, be formed with a vertical source-channel-drain configuration in a semiconductor body and with the channel area 4 extending parallel to, for example, a side-wall of a groove present in a major surface of the body.

As mentioned hereinbefore the invention is also applicable to field-effect devices other than transistors, for example charge-coupled devices.

I claim:

1. A field-effect device comprising a semiconductor body in which a channel area of the device is present, a drain zone present in the body and situated adjacent the channel area, a drain electrode electrically connected to the drain zone, a gate situated over and separated from the channel area by a barrier layer, a gate connection for biasing the gate independently of the drain electrode to control by field-effect action across the barrier layer the passage of charge-carriers along a current path through said channel area, and field-relief means connected to said gate and extending above the drain zone towards said drain electrode, said drain zone having a sufficiently low doping that during operation of the device said field-relief means serve to spread the electrostatic field which occurs in this low-doped drain zone and to reduce at the body surface the magnitude of said field at the edge of said low-doped drain zone adjacent the channel area, characterized in that said field-relief means comprise a resistance layer which extends over the low-doped drain zone and is electrically connected between the gate and drain electrode free of a source electrode to permit during operation of the device the formation of a potential distribution along the resistance layer between the gate and drain electrode and over the current path in the underlying low-doped drain zone.

2. A device as claimed in claim 1, in which the conductivity-type determining doping concentration of said low-doped drain zone is less than $2 \times 10^{17}$ dopant atoms per c.c.

3. A device as claimed in claim 1 or claim 2, in which the conductivity-type determining doping concentration of said low-doped drain zone is more than $2 \times 10^{16}$ dopant atoms per c.c.

4. A device as claimed in claim 2, in which the said doping concentration is at most $10^{17}$ dopant atoms per c.c.

5. A device as claimed in claim 1, 2 or 4, in which an insulating layer is present on the semiconductor body surface to separate said low-doped drain zone from the overlying resistance layer.

6. A device as claimed in claim 5, in which said insulating layer also separates said channel area from the gate and is of substantially the same thickness both below the resistance layer and below the gate.

7. A device as claimed in claim 1, 2 or 4, in which the resistance layer and gate comprise parts which adjoin each other, one of said parts being situated on top of the other of said parts.

8. A device as claimed in claim 1, 2 or 4, in which the resistance layer and drain electrode comprise parts which adjoin each other, one of said parts being situated on top of the other of said parts.

9. A device as claimed in claim 1, 2 or 4, in which the low-doped drain zone has a higher conductivity-type determining dopant concentration than the channel area.

10. A device as claimed in claim 3, in which said doping concentration is at most $10^{17}$ dopant atoms per c.c.

* * * * *